US006450155B1

(12) United States Patent
Arkfeld

(10) Patent No.: US 6,450,155 B1
(45) Date of Patent: Sep. 17, 2002

(54) IN-LINE FUEL CONDITIONER

(76) Inventor: Douglas Lee Arkfeld, 1749 N. Vulcan Ave., Encinitas, CA (US) 92024

( * ) Notice: Subject to any disclaimer, the term of this patent is extended or adjusted under 35 U.S.C. 154(b) by 0 days.

(21) Appl. No.: 09/904,874

(22) Filed: Jul. 12, 2001

(51) Int. Cl.[7] ............................ G03F 1/08; H01L 21/30
(52) U.S. Cl. ....................................................... 123/538
(58) Field of Search ................................. 123/536, 537, 123/538; 210/687

(56) References Cited

U.S. PATENT DOCUMENTS

| | | | | | |
|---|---|---|---|---|---|
| 4,429,665 | A | * | 2/1984 | Brown | 123/538 |
| 4,715,325 | A | | 12/1987 | Walker | |
| 4,930,483 | A | | 6/1990 | Jones | |
| 4,959,155 | A | * | 9/1990 | Gomez | 210/687 |
| 5,013,450 | A | * | 5/1991 | Gomez | 210/687 |
| 5,044,347 | A | | 9/1991 | Ullrich et al. | |
| 5,048,499 | A | | 9/1991 | Daywalt | |
| 5,069,190 | A | | 12/1991 | Richards | |
| 5,092,303 | A | | 3/1992 | Brown | |
| 5,154,153 | A | | 10/1992 | MacGregor | |
| 5,167,782 | A | | 12/1992 | Marlow | |
| 5,197,446 | A | | 3/1993 | Daywalt et al. | |
| 5,451,273 | A | | 9/1995 | Howard et al. | |
| 5,524,594 | A | | 6/1996 | D'Alessandro | |
| 5,730,109 | A | | 3/1998 | Nozawa | |
| 5,738,692 | A | | 4/1998 | Wright | |
| 5,881,702 | A | | 3/1999 | Arkfeld | |
| 6,000,381 | A | * | 12/1999 | Berlin et al. | 123/538 |

OTHER PUBLICATIONS

Product Data Sheet for Stainless Steel—Nov. 1997.

* cited by examiner

*Primary Examiner*—Marguerite McMahon
(74) *Attorney, Agent, or Firm*—Knobbe Martens Olson & Bear LLP

(57) ABSTRACT

A fuel conditioner adapted to be placed in-line in a fuel delivery system of an internal combustion engine system. The fuel conditioner include a metallic housing containing a plurality of reactive anti-biological elements. The fuel conditioner also includes a high Gauss magnet. The fuel passes over the anti-biological elements and adjacent the magnet such that growth of biological agents entrained within the fuels is inhibited. The fuel also passes adjacent the magnet such that ferrous particles entrained within the fuel are retained with the fuel conditioner and removed from the fuel flow.

6 Claims, 2 Drawing Sheets

IN-LINE FUEL CONDITIONER

BACKGROUND OF THE INVENTION

1. Field of the Invention

The present invention relates to a fuel conditioner adapted to be placed in-line in a fuel delivery system and is adapted to condition fuel for improved purity, extended storage life, and reduced-engine wear.

2. Description of the Related Art

Internal combustion engine systems typically are provided fuel from a remote storage tank via fuel lines and the fuel is driven either by gravity or an active pump. The systems often include an in-line filter to remove particulate impurities. However, filters typically are passive devices that can only screen out particles above a certain size.

Filters are relatively ineffectual against biological processes that often occur in fuel. As an example, diesel fuel often accumulates water in storage. The fuel, especially with water present, can support the growth of certain bacteria, fungi, and algae. It is known to add anti-biological agents such as bactericides and fungicides to the fuel, however this requires the undesirable additional effort of adding the anti-biological agents to the fuel.

An additional contaminant that can be present in fuel that is not particularly well handled by conventional filters is metal contamination. Small particles of metal can become entrained in the fuel from wear in fuel pumps and corrosion in fuel delivery systems. These small metallic particles can be too small to be effectively trapped by a filter, yet large enough to cause undesirable wear and deposits in the engine.

From the foregoing, it can be appreciated that there is a need for a fuel conditioning system that can inhibit the growth of biological contaminants in fuel yet avoids the inconvenience of mixing additives with the fuel. There is also a need for a system to remove metallic particles from a fuel supply.

SUMMARY OF THE INVENTION

The aforementioned needs are satisfied by the present invention which, in one aspect, is an in-line fuel conditioner receiving a flow of liquid fuel the conditioner comprising a housing, end caps attached to ends of the housing and a plurality of reactive elements contained within the housing such that the fuel passes over the reactive elements and wherein the reactive elements comprise separate stainless steel, zinc, and copper members such that the overall composition of the reactive elements is approximately 50–40% stainless steel, 40–30% zinc, and 30–20% copper by weight and wherein the in-line fuel conditioner inhibits the growth of biological agents entrained within the fuel. In certain embodiments, the invention also includes a magnet wherein the magnet retains ferrous metal particles entrained within the fuel flow and in one embodiment, the magnet is positioned with the housing. In certain embodiments, the reactive elements are approximately 0.125" in major dimension. In another aspect, the invention is an internal combustion engine system utilizing fuel and including an in-line fuel conditioner wherein the in-line fuel conditioner contains a plurality of reactive elements comprising separate stainless steel, zinc, and copper members wherein the reactive elements have a weight composition of 50–40% stainless steel, 40–30% zinc, and 30–20% copper and a magnet wherein the in-line fuel conditioner inhibits the growth of biological contaminants and retains ferrous particulates entrained within the fuel.

The in-line fuel conditioner of the present invention can be readily installed in an existing fuel delivery system using commonly available tools and known mechanical techniques. The fuel conditioner inhibits the growth of biological contaminants without the inconvenience of treating the fuel with additives. The fuel conditioner also retains ferrous particulates entrained within the fuel thereby reducing wear to an engine system so equipped. These and other objects and advantages will become more fully apparent from the following description taken in conjunction with the accompanying drawings.

DETAILED DESCRIPTION OF THE PREFERRED EMBODIMENT

Figure 1:
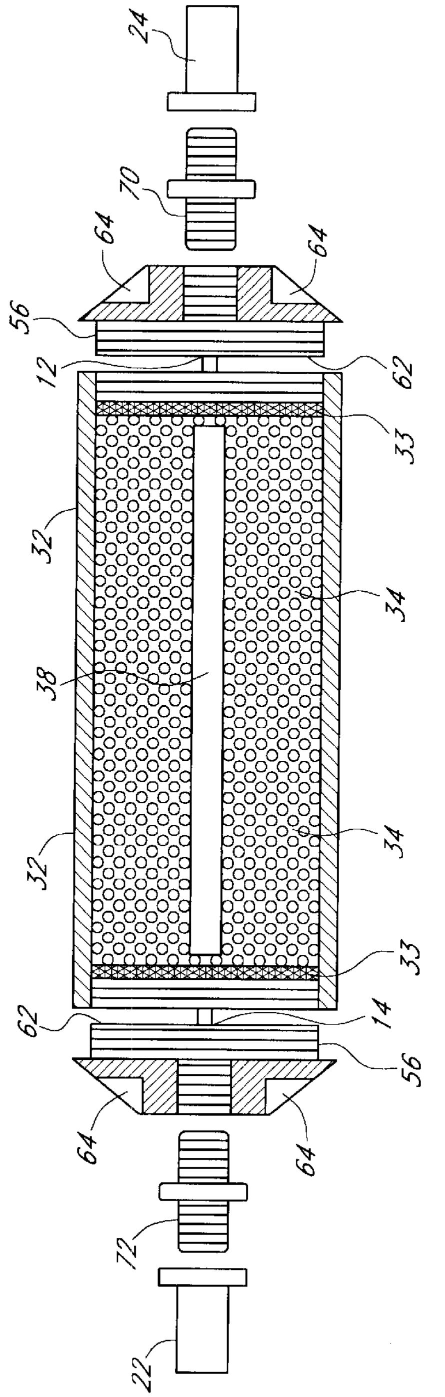
FIG. 1 is an exploded section view of an in-line fuel conditioner.

Reference will now be made to the drawings wherein like numerals refer to like parts throughout. FIG. 1 is an exploded section view of one embodiment of an in-line fuel conditioner 10. The in-line fuel conditioner 10 receives a flow of liquid fuel, such as diesel, gasoline, methanol, and the like at an inlet port 12 and provides the liquid fuel at an outlet port 14. The in-line fuel conditioner 10 inhibits growth of biological agents and retains ferrous metal particles entrained within the fuel. The in-line fuel conditioner 10 is adapted for fitment in internal combustion engine systems wherein the fuel is provided under pressure feed via a pump from a remote fuel tank and the portions of fuel not used by the engine are returned to the remote fuel tank. As the engine systems typically provide fuel from the pump at a much greater volume than is used by the engine under most operating conditions, much of the fuel is recirculated to the storage tank. Thus, a given portion of fuel typically passes repeatedly through the in-line fuel conditioner 10 before being supplied to the combustion chambers of the engine.

Figure 2:
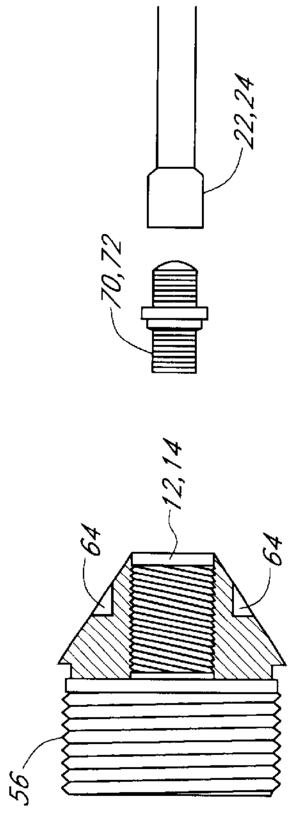
FIG. 2 is an enlarged exploded view of one embodiment of an end cap and fuel line connection with the end cap portion shown in section view.

The in-line fuel conditioner 10 comprises a housing 32. In one embodiment, the housing is generally cylindrical with an I.D. of approximately 1.75 inches, an O.D. of approximately 2.25 inches, and is approximately 3 to 6 inches long. In this embodiment, the housing 32 is made of aluminum alloy such as the 6061 alloy commercially available. The housing 32 is internally threaded at a first and a second end so as to receive end caps 56. The end caps 56 are externally threaded 62 to mate with the ends of the housing 32 and in this embodiment are made of aluminum alloy. The end caps 56 are provided with two flats 64 to facilitate installation of the end caps 56 in the housing 32 with an open or adjustable wrench in a well understood manner. In the embodiment illustrated in FIGS. 1 and 2, the end caps 56 are a compression fit to the housing 32, such as via pipe threads.

The ends caps 56 are also internally threaded so as to receive couplers 70,72. The couplers 70 are externally threaded on both ends so as to facilitate threaded engagement with fuel lines 22,24. The fuel lines 22,24 are tubular lines adapted to carry fuel and are typically provided by the manufacturer of the internal combustion engine system. It should be understood that to install the in-line fuel conditioner 10, the fuel lines 22,24 would be cut and internally threaded in a well understood manner with commonly available tools.

The in-line fuel conditioner 10 also comprises two seals 33. The seals 33 are generally circular members approximately 2 inches in diameter and ⅛ inch thick. The seals 33 of this embodiment, are made of neoprene rubber. The seals 33 are provided with a circular center hole approximately 1.85 inches in diameter to permit the flow of fuel therethrough. It will be appreciated that a porous cover, such as a screen or fabric material, is positioned over the center hole to preclude reactive elements described in greater detail below from exiting the housing 32. The seals 33 are positioned inside the housing 32 immediately inboard of the end caps 56 and are adapted to friction fit in the interior of the housing 32.

Figure 6:
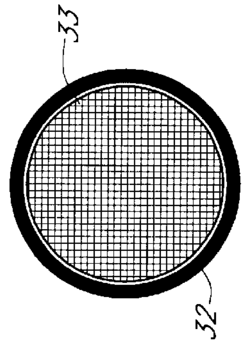
FIG. 6 is a section view of a housing of the in-line fuel conditioner.
Figure 3:
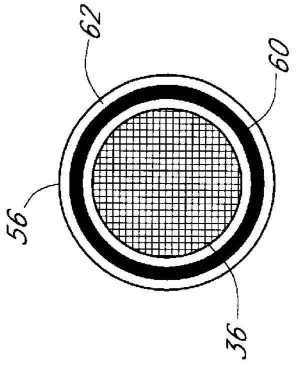
FIG. 3 is an inside end view of the end cap of FIG. 3.
Figure 5:
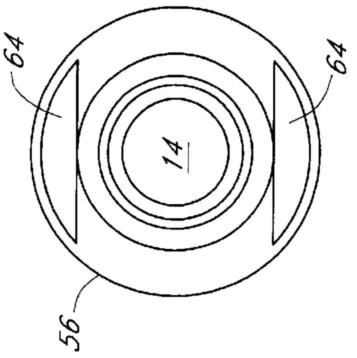
FIG. 5 is a front view of the end cap of FIG. 3.

FIG. 3 is an end view of an alternative embodiment of an end cap 56. In this embodiment, the end cap 56 has straight threads 62 rather than the pipe threads 62 of the previous embodiment and also includes an annular o-ring 60. The o-ring 60 is adapted to be interposed between the housing 32 and the end cap 56 as the end cap 56 is threaded into the housing 32 to improve the sealing therebetween in a well known manner. The seal 33 of this embodiment (FIG. 6), is made of a corrosion resistant screen material.

Figure 4:
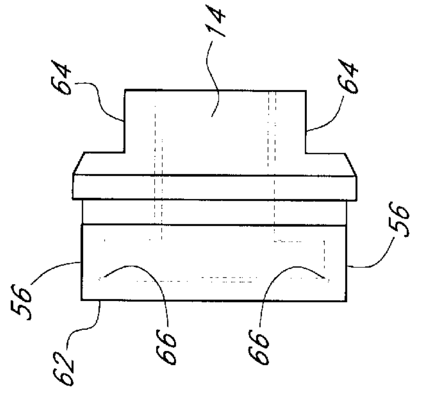
FIG. 4 is a side view of the end cap of FIG. 3.

FIG. 4 illustrates yet another embodiment of an end cap 56. In this embodiment, the end cap 56 is a two piece assembly wherein the two pieces of the end cap 56 are threaded to fit together in a known manner. In this embodiment, the end caps 56 are adapted to retain the fuel lines 22,24 in a compression fitting. In this embodiment, ends of the fuel lines 22,24 are flared 66 as illustrated in FIG. 4 to facilitate retention with the end caps 56.

The in-line fuel conditioner 10 also comprises a plurality of reactive elements 34 positioned inside the housing 32 between the seals 33. The reactive elements 34 in this embodiment, comprise generally spherical stainless steel and zinc alloy members and copper wire members. The stainless steel reactive element 34 members in this embodiment comprise type 302 alloy commercially available and are approximately 0.125" in diameter. The zinc alloy reactive element 34 members comprise an alloy of approximately 95% pure Sn and are approximately 0.125 inches in diameter. The copper reactive element 34 members are approximately 0.125 inches in major dimension. The reactive elements 34 are combined so as to have an overall composition of approximately 50–40% stainless steel, 40–30% zinc, and 30–20% copper by weight. The relative composition and dimensions of the reactive elements 34 described in this embodiment have exhibited the optimal combination of anti-biological reactivity and minimal flow restriction during use.

The in-line fuel conditioner 10 also comprises a magnet 38. The magnet 38 is a bar magnet approximately 0.25 inches in diameter and 0.25 to 2 inches long and is made of known ferromagnetic materials. The magnet 38 of this embodiment develops a magnetic field of at least 4000 Gauss as measured 0.17 inches from the surface of the magnet 38. In this embodiment, the magnet 38 is positioned within the housing 32. It will be appreciated that the magnet 38 will magnetize the stainless reactive elements 34.

In use, fuel enters the interior of the in-line fuel conditioner 10 and thus flows around the reactive elements 34 and the magnet 38. The fuel interacts with the reactive elements 34 so as to inhibit growth of biological contaminants, such as bacteria, algae, and fungi, entrained therein. Ferrous particles entrained within the fuel will be attracted to and retained on the surface of the magnet 38 and the stainless steel reactive elements 34. It should be appreciated that in a typical installation, the instantaneous supply rate of fuel is much greater than is actually consumed by the engine and the unused fuel is returned to the storage tank. This unused fuel is then resupplied via the fuel lines 22,24 and thus a given quantity of fuel will typically pass through the fuel lines 22,24 and thus the in-line fuel conditioner 10 repeatedly before being consumed. Thus, the fuel stored in the storage tank will have passed through the in-line fuel conditioner 10 several times further improving the resistance of the fuel so conditioned to growth of biological contaminants.

The Applicant also believes that the reactive elements 34 and the magnet 38 impart beneficial conditioning to the fuel to improve the combustion characteristics of the fuel in the engine system. The Applicant has observed improved atomization of the fuel in the combustion chamber of the engine system and reduced undesired emissions therefrom. The Applicant has also observed improved fuel economy of engine systems provided with the in-line fuel conditioner 10 as previously described.

It will be appreciated that in alternative embodiments, the housing 32 and end caps 56 can be made of titanium, stainless steel, fibre-reinforced plastic, or other high strength, corrosion resistant materials. It should also be appreciated that the dimensions indicated herein are illustrative only and one of skill in the art can vary the dimensions to accommodate greater or lesser fuel flow rates. It will also be appreciated that the in-line fuel conditioner 10 described herein is useful in fuel refining and transportation environments.

Although the foregoing description of the preferred embodiment of the present invention has shown, described, and pointed out the fundamental novel features of the invention, it will be understood that various omissions, substitutions, and changes in the form of the detail of the apparatus as illustrated as well as the uses thereof, may be made by those skilled in the art without departing from the spirit of the present invention. Consequently, the scope of the present invention should not be limited to the foregoing discussions, but should be defined by the appended claims.

What is claimed is:

1. An in-line fuel conditioner receiving a flow of liquid fuel the conditioner comprising:

a housing;

end caps attached to ends of the housing; and a plurality of reactive elements contained within the housing such that the fuel passes over the reactive elements and wherein the reactive elements comprise. separate stainless steel, zinc, and copper members such that the overall composition of the reactive elements is approximately 50–40% stainless steel, 40–30% zinc, and 30–20% copper by weight and wherein the in-line fuel conditioner inhibits the growth of biological agents entrained within the fuel.

2. The in-line fuel conditioner of claim 1, further comprising a magnet wherein the magnet retains ferrous metal particles entrained within the fuel flow.

3. The in-line fuel conditioner of claim 2 wherein the-magnet is positioned within the housing.

4. The fuel conditioner of claim 1 wherein the reactive elements are approximately 0.125" in major dimension.

5. An in-line fuel conditioner receiving a fuel flow the conditioner comprising:

a housing;

end caps attached to ends of the housing;

a magnet positioned with the housing; and a plurality of reactive elements arranged within the housing such that the fuel passes over the reactive elements and wherein the reactive elements comprise separate stainless steel, zinc, and copper members such that the overall composition of the reactive elements is approximately 50–40% stainless steel, 40–30% zinc, and 30–20% copper by weight and wherein the in-line fuel conditioner inhibits the growth of biological agents and retains ferrous particulates entrained within the fuel.

6. An internal combustion engine system utilizing fuel and including an in-line fuel conditioner wherein the in-line fuel conditioner contains a plurality of reactive elements comprising separate stainless steel, zinc, and copper members wherein the reactive elements have a weight composition of 50–40% stainless steel, 40–30% zinc, and 30–20% copper and a magnet wherein the in-line fuel conditioner inhibits the growth of biological contaminants and retains ferrous particulates entrained within the fuel.

* * * * *